United States Patent [19]
Hong

[11] Patent Number: 5,665,624
[45] Date of Patent: Sep. 9, 1997

[54] METHOD FOR FABRICATING TRENCH/ STACKED CAPACITORS ON DRAM CELLS WITH INCREASED CAPACITANCE

[75] Inventor: Gary Hong, Hsin-Chu, Taiwan

[73] Assignee: United Microelectronics Corporation, Hsin-Chu, Taiwan

[21] Appl. No.: 735,221

[22] Filed: Oct. 22, 1996

Related U.S. Application Data

[60] Provisional application No. 60/010,995 Feb. 1, 1996.

[51] Int. Cl.$^6$ .................................................. H01L 21/8242
[52] U.S. Cl. ............................ 438/244; 438/387; 438/249
[58] Field of Search ............................ 437/47, 52, 60, 437/919, 203

[56] References Cited

U.S. PATENT DOCUMENTS

| | | | |
|---|---|---|---|
| 5,066,608 | 11/1991 | Kim et al. | 437/52 |
| 5,183,772 | 2/1993 | Motonami | 437/52 |
| 5,234,856 | 8/1993 | Gonzales | 437/47 |
| 5,362,664 | 11/1994 | Jun | 437/52 |
| 5,521,111 | 5/1996 | Sato | 437/52 |

*Primary Examiner*—Jey Tsai
*Attorney, Agent, or Firm*—William H. Wright

[57] ABSTRACT

A method is described for making an array of dynamic random access memory (DRAM) cells having a trench/ stacked capacitor within each cell. The method involves forming trenches in the silicon substrate at the capacitor node contact areas of the DRAM cells, and using liquid phase deposition (LPD) of silicon oxide in the trenches to form oxide plugs that extend upward into the openings in the photoresist mask used to etch the trenches. After removing the photoresist, polysilicon sidewall spacers are formed on the LPD oxide plugs. The sidewall spacers become part of the stacked capacitor structures. Another patterned polysilicon layer is used to form the array of storage-node electrodes for the stacked capacitors, and also serve as the storage-node electrodes for the trench capacitors. Conventional methods are used to complete the array of trench/stacked capacitors by depositing an interelectrode dielectric layer and then forming the polysilicon top electrodes.

10 Claims, 4 Drawing Sheets

METHOD FOR FABRICATING TRENCH/STACKED CAPACITORS ON DRAM CELLS WITH INCREASED CAPACITANCE

This application claims priority from provisional application Ser. No. 60/010,995, filed Feb. 1, 1996.

BACKGROUND OF THE INVENTION

1. Field of the Invention

This invention relates to the manufacture of a dynamic random access memory (DRAM) device and more particularly, to a method for fabricating an array of DRAM cells, each DRAM cell having a stacked capacitor.

2. Description of the Related Art

Dynamic random access memory (DRAM) circuits are used in the electronics industry for storing information as binary data DRAMs are formed on chips diced from semiconductor substrates and consist of an array of memory cells and peripheral circuits for randomly accessing the memory cells to store and retrieve digital information. Individual DRAM cells are composed of a single field effect transistor (FET), commonly referred to as a pass transistor, and a charge storage capacitor. Some storage capacitors in modern DRAMs are formed within trenches in the semiconductor substrate (i.e., trench capacitors), or alternatively, storage capacitors may be formed as stacked capacitors with the conductive plates of the stacked capacitors extending over the pass transistor and over other portions of the DRAM cell.

In recent years, the density of cells on the DRAM chip has increased dramatically because of improvements in such semiconductor technologies as high resolution photolithography and directional plasma etching. Recent DRAM designs provide 64 Megabits of storage on a single chip, and the number of bits on a chip is expected to reach 256 Mbits by the year 1998. As this cell density increases, it is necessary to reduce the area of each cell to maintain a reasonable chip size and to improve the circuit performance. Unfortunately, as the cell size decreases it is necessary to reduce the storage capacitor size to limit the amount of substrate surface area occupied by the capacitor. This results in decreased charge stored on the capacitor that makes it more difficult to detect the stored charge on the capacitor during the read cycle because of the lower signal to noise ratio at the sense amplifiers. These smaller charge storage cells also require more frequent refresh cycles to maintain measurable charge levels on the capacitors. Therefore, there is a strong need in the electronics industry to increase the capacitance that is obtained from a charge storage capacitor while reducing the cell area.

The stacked capacitor approach to increasing capacitance has received considerable interest in recent years because of the variety of ways that the capacitor electrodes can be formed in the vertical (third) dimension over the FET and within the cell area to increase the capacitance while maintaining or reducing the cell area. For example, U.S. Pat. No. 5,362,664 to Jun describes a method for forming a stacked capacitor having fin-shaped electrodes. The Jun patent is exemplary of at least some conventional stacked capacitor formation processes.

Another approach for increasing the memory cell capacitance is to fabricate both a trench capacitor and a stacked capacitor in the same DRAM cell area. For example, U.S. Pat. No. 5,234,856 to Gonzales describes a method for forming a trench capacitor. The method involves etching a trench in the node contact area (one of the two FET source/drain areas) of the substrate, and then forming a conventional single plate storage-node electrode (bottom electrode) for the stacked capacitor that also serves as the bottom electrode for the trench capacitor. This results in a stacked-trench capacitor that increases the cell capacitance and also makes the memory cell more immune to soft errors (discharging) induced by high energy particles, such as naturally occurring alpha particles.

However, as the DRAM cell area continues to decrease in size, there is still a strong need in the semiconductor industry to maintain or further increase the capacitance of the storage capacitor while providing a low cost manufacturing process.

SUMMARY OF THE PREFERRED EMBODIMENTS

It is the principal object of this invention to provide an improved dynamic random access memory (DRAM) cell structure having both a trench capacitor and a stacked capacitor, with increased capacitance, and a method of fabrication.

It is another object of this invention to increase the capacitance of the stacked capacitor structure by forming vertical extensions on the bottom electrode of the stacked capacitor that are self-aligned to the perimeter of the trench capacitor, further increasing the capacitance.

It is another object of the invention to use a low temperature liquid phase deposited silicon oxide to achieve this new DRAM cell structure which provides a simple, cost effective manufacturing process.

An aspect of the present invention provides a process for fabricating a DRAM. A substrate is providing and a MOS transistor having a gate and source and drain regions on the substrate. A charge storage capacitor coupled to the MOS transistor is formed by etching a trench in the substrate adjacent to the MOS transistor. A plug is formed within the trench and extending above the upper surface of the substrate. Spacer material is deposited over the substrate and on the plug wall, followed by the selective etching of the plug from the spacer material and from the trench. A first polysilicon layer is deposited over the spacer material and within the trench, a dielectric film is formed over a surface of the first polysilicon layer, and a second polysilicon layer is formed over at least a portion of the dielectric film.

According to a further aspect, the plug comprises silicon oxide formed by liquid phase deposition. In a still further aspect of the invention, the plug is formed by liquid phase deposition onto a native oxide film formed on the substrate within the trench.

A different aspect of the present invention provides a method for fabricating a dynamic random access memory (DRAM) device. A substrate is provided that has MOS transistors formed thereon, the MOS transistors having heavily doped source/drain regions and gates formed from a patterned first polysilicon layer. A first insulating layer is deposited on the patterned first polysilicon layer and elsewhere on the substrate and a photoresist layer is formed and patterned to provide openings in the photoresist layer having essentially vertical sidewalls over the source/drain areas. Trenches are anisotropically etched in the silicon substrate through the openings in the photoresist layer. A native oxide is formed on silicon surfaces in the trenches and silicon oxide is selectively deposited by liquid phase deposition (LPD) in the trenches and in the photoresist openings so that the LPD silicon oxide extends above the silicon substrate surface. The photoresist layer is removed to leave LPD silicon oxide plugs in the trenches and extending above the substrate surface. A conformal second polysilicon layer is deposited on the LPD silicon oxide plugs and, by anisotropically etching back the second polysilicon layer to the first insulating layer, polysilicon sidewall spacers are formed on the LPD silicon oxide plugs. The LPD oxide is selectively etched to form free standing sidewall spacers self-aligned to the perimeter of the trenches. Bottom electrodes are formed by depositing and patterning a third polysilicon layer into the trenches and on the sidewall spacers. An interelectrode dielectric insulating layer is formed on the bottom electrodes, and a fourth polysilicon layer is deposited and patterned to form top electrodes.

BRIEF DESCRIPTION OF THE DRAWINGS

The objects and advantages of this invention are best understood in the preferred embodiment with reference to the attached drawings which are now briefly described.

DESCRIPTION OF THE PREFERRED EMBODIMENTS

Now in keeping with the objects of this invention, methods for forming an array of DRAM cells having trench/stacked storage capacitor with increased capacitance are now described.

Figure 1:
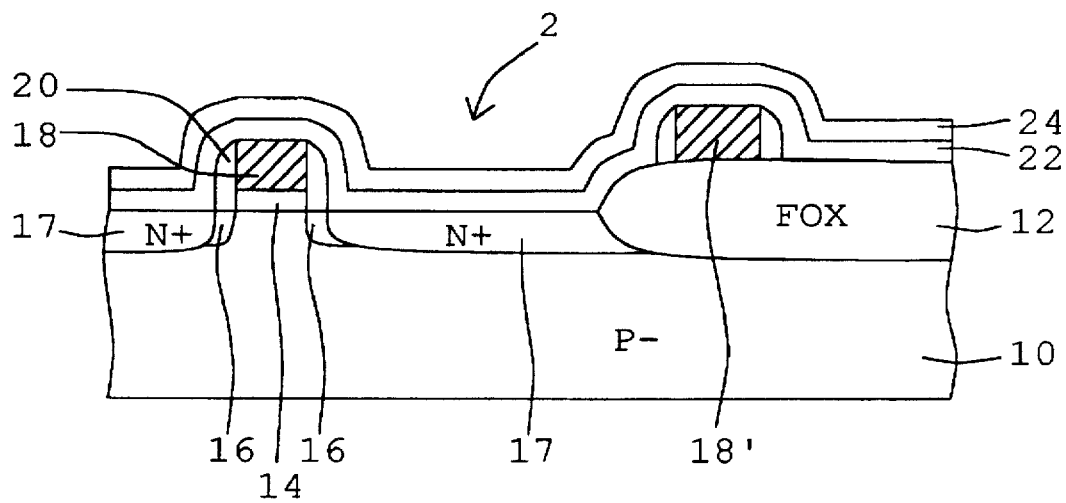
FIGS. 1 through 7 show schematic cross-sectional views for a single one of the multitude of DRAM cells concurrently formed by the method of this invention. The sequence of cross sectional views shows the process steps used to form DRAM cells having trench/stacked capacitors where the vertically extending sidewalls of the stacked capacitors are self-aligned to the corresponding trench capacitors.

Referring to FIG. 1, a schematic cross-sectional view is shown for a DRAM cell partially completed in and on the surface of a substrate 10. The preferred substrate is composed of P-type single crystal silicon having a <100> crystallographic orientation and doped with boron (B) to a dopant concentration of between about $5.0\times10^{17}$ to $5.0\times10^{18}$ atoms/cm$^3$. A relatively thick Field OXide (FOX) 12 is formed around device areas to electrically isolate the device areas. For simplicity, the drawing shows only a portion of the field oxide 12 to the right of a single one of the many device areas typically included in a DRAM circuit. Although the field oxide can be formed by various methods, the commonly used method of forming the FOX 12 is the LOCal Oxidation of Silicon (LOCOS), which is now briefly described without showing the individual steps in the figures. The method involves depositing onto the surface of the substrate 10 a thin silicon oxide (pad oxide) and a thicker silicon nitride layer (both layers not shown). The nitride layer is patterned by conventional photolithographic means leaving portions of the nitride layer over the planned device areas as a barrier to oxidation. The silicon substrate is then subjected to an oxidizing ambient (steam) to form the field oxide 12. Typically, the field oxide 12 is between about 3000 to 6000 Å thick.

After removing the silicon nitride layer and the pad oxide layer in a conventional wet etch using, for example, hot phosphoric acid to etch the nitride layer and hydrofluoric acid to etch the pad oxide, FET devices are formed in the device areas. The most commonly used device to serve as the pass transistor for the dynamic random access memory cells is the N-channel FET having an N+ doped polysilicon gate electrode. The FET may be formed by first thermally oxidizing the device area to form a thin gate oxide 14 having a thickness typically between about 80 to 150 Å. After forming the gate oxide 14, a first polysilicon layer 20 is deposited and patterned by conventional photolithographic techniques and anisotropic plasma etching to form an array of polysilicon strips that form FET gate electrodes 20 on the gate oxide 14 in the device area and also form the interconnecting word lines 18' that lie at least partially on the field oxide areas 12. The word lines 18' electrically may connect the FET gate electrodes to the peripheral circuits on the DRAM chip. Typically, the first polysilicon layer 20 is deposited by low pressure chemical vapor deposition (LPCVD) using the thermal decomposition of a reactant gas such as silane (SiH$_4$). The first polysilicon layer is then doped by ion implantation using, for example arsenic (As$^{75}$), and the dopant concentration in the polysilicon after implantation is typically between about $3.0\times10^{20}$ to $3.0\times10^{21}$ atoms/cm$^3$.

Lightly doped source/drain areas 16 for the N-channel FETs are formed adjacent to the gate electrodes 18, as shown in FIG. 1. The lightly doped source/drain areas are usually formed by ion implanting an N-type dopant, such as arsenic (As$^{75}$), using the masking effect of the gate electrodes to form the lightly doped source/drain areas in a manner self-aligned to the gate electrodes. A photoresist mask is commonly used to prevent implantation in other areas of the substrate where N-type implants are not desired, such as in P-channel FETs within CMOS circuits in the peripheral areas on the chip. A typical implantation dose for the source/drain areas is between about $5.0\times10^{12}$ to $5.0\times10^{13}$ atoms/cm$^2$ and the ion implant energy is between about 50 to 100 KeV.

As is also shown in FIG. 1, sidewall spacers 20 may be formed on the sidewalls of the gate electrodes 18 by depositing an insulating sidewall spacer material, typically silicon oxide (SiO$_2$), and anisotropically etching back by plasma etching to the top surface of the gate electrodes 18. Heavily N doped source/drain contact areas 17 are formed in the device areas adjacent to the sidewall spacers 20 to provide low resistance ohmic contacts for the FETs. Typically, a second ion-implantation is used to form the source/drain regions 17, for example using arsenic (As$^{75}$) or phosphorus (P$^{31}$). The sidewall spacers 20 and field oxide 12 serve as an implantation mask for forming the heavily doped source/drain regions 17 mask. Preferably, the dose is between about $1.0\times10^{15}$ to $1.0\times10^{16}$ ions/cm$^2$ and the implant energy is between about 50 to 100 KeV. After the FETs are completed, the trench/stacked storage capacitors are formed next in and on one of the two source/drain contact areas 17 of each FET in the array of cells. The second source/drain contact in each memory cell is used later for the bit line contacts.

Referring still to FIG. 1, the method for making the array of trench/stacked capacitors includes depositing a first insulating layer 22 over the FETs in the device areas and on the field oxide areas 12. The insulating layer 22 is preferably composed of silicon oxide (SiO$_2$) and is deposited by low pressure chemical vapor deposition (LPCVD) using a reactant gas such as tetraethyloxysilane (TEOS). The preferred thickness of layer 22 is between about 1000 to 3000 Å. A second insulating layer 24, substantially different in composition and having a significantly lower etch rate than silicon oxide in hydrofluoric acid (HF), is then deposited on layer 22. Layer 24 is preferably composed of silicon nitride (Si$_3$N$_4$) and has a thickness sufficient to function as an etch stop, which may be about 1000 Å. Silicon nitride layer 24 can also be deposited using LPCVD by using a reactant gas mixture such as dichlorosilane (SiCl$_2$H$_2$) and ammonia (NH$_3$).

Figure 2:
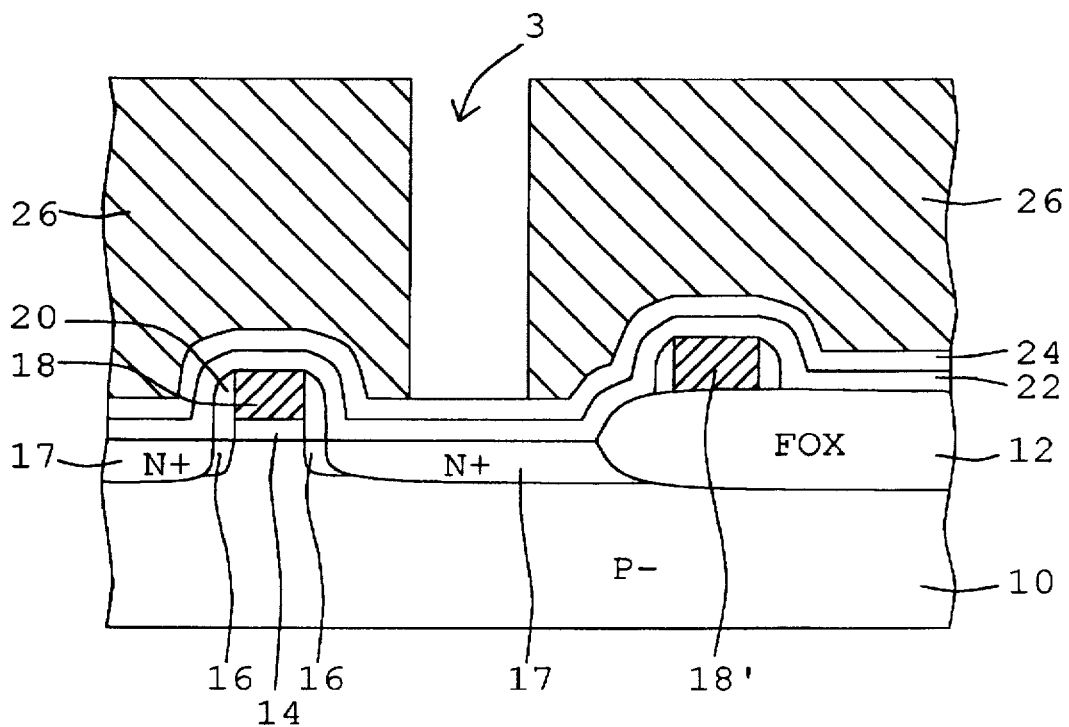

Referring now to FIG. 2, a relatively thick photoresist layer 26 is spin coated on the substrate surface, and conventional photolithographic exposure and development techniques are used to form openings 3 over each of the FET source/drain contact areas 17 where the node contacts for the trench/stacked capacitors are to be formed. The openings 3 in the photoresist preferably have essentially vertical sidewalls, as depicted in FIG. 2, because openings in the photoresist having such vertical walls is particularly useful in forming disposable plug structures. Any commercially available photoresist can be used so long as patterning the photoresist provides openings having vertical walls and the photoresist exhibits appropriate durability to subsequent processing steps.

Figure 3:
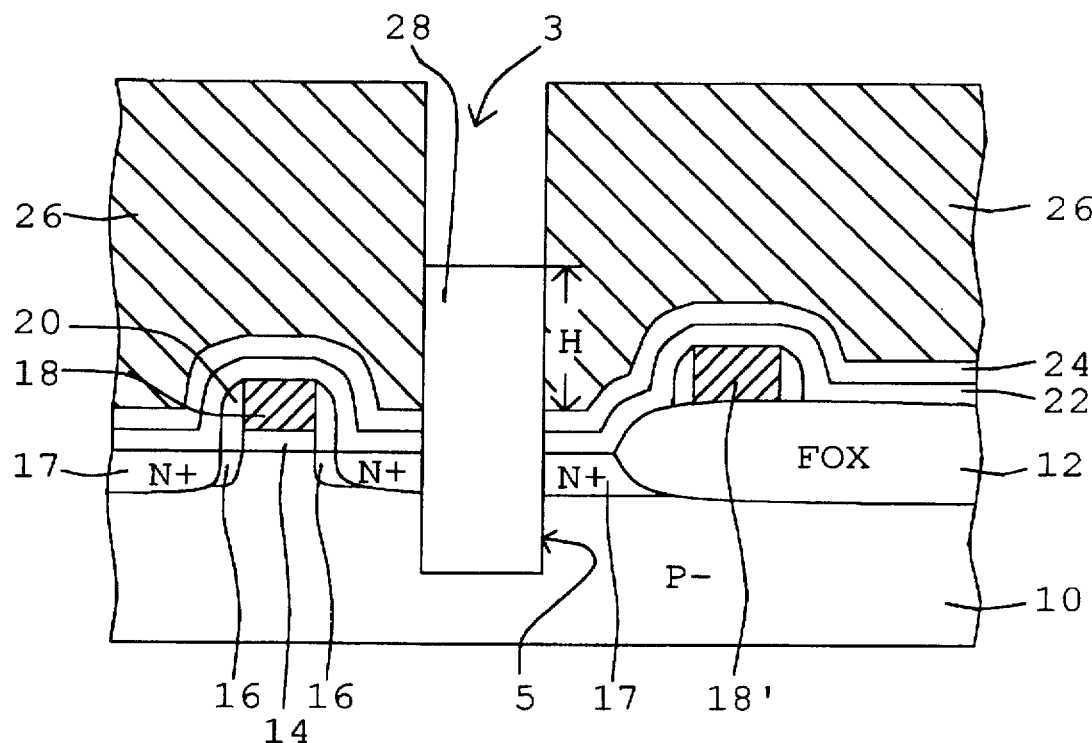

Now, as shown in FIG. 3, the second insulating layer 24 and the first insulating layer 22 exposed at the photoresist openings 3 are removed using anisotropic plasma etching. The preferred etch can be achieved in a reactive ion etcher (RIE) or another high density plasma etcher using, for example, an etch gas containing carbon tetrafluoride ($CF_4$). Trenches having essentially vertical sidewalls are then formed through the source/drain contact areas 17 and into the P-type silicon substrate 10 by continuing the anisotropic etching process with the same photoresist masking layer 26. One trench formed by this process is labeled 5 in FIG. 3. The etching of the trenches from the silicon substrate is accomplished anisotropically using a plasma etcher and preferably using an etch gas mixture containing chlorine ($Cl_2$) and a carrier gas such as argon (Ar). The etching sequence for etching layer 24, 22 and the trenches 5 in substrate 10 is preferably performed in a multi-chamber processing system (multi-chamber etcher). The etching can also be carried out in a single chamber by merely purging and changing the etch gas mixture after each etch step. The depth of the trench 5 in the substrate is determined by device design requirements, and may extend more than a micron below the surface of the silicon substrate 10.

Still referring to FIG. 3, the trenches in the substrate 10 and the openings in the photoresist layer 26 are now selectively filled with silicon oxide using low temperature (about 35° C.) liquid phase deposition (LPD) to form an LPD silicon oxide plug 28, as shown filling trench 5 and partially filling the opening 3 in FIG. 3. Prior to the liquid phase deposition of the oxide plug, the substrate is immersed in deionized water to ensure that a contamination free native oxide (about 20 Å) is present on the exposed silicon surface of the trench 5, thereby providing a "seed" or nucleation layer for the selective deposition of the LPD silicon oxide plug 28. The liquid phase deposition of the LPD silicon oxide is performed in a supersaturated solution of hydrofluorsilicic acid ($H_2SiF_6$). The method, more specifically, involves dissolving a pure silicon oxide powder, such as formed by the sol-gel method from tetraethyloxysilane (TEOS), in an $H_2SiF_6$ acid solution to form a saturated solution at about 25° to 30° C. For example, a 40 percent by weight aqueous solution of hydrofluorsilicic acid is manufactured by the Morita Kagaku Kogyo Co. of Japan. The saturated solution is then transferred to a Teflon vessel for film deposition which is placed in a water bath to maintain a temperature of between about 33° to 37° C. The substrates are then immersed in the solution for liquid phase deposition (LPD). During the deposition, an aqueous solution of boric acid $H_3BO_3$) is continuously added to the hydrofluorsilicic acid solution by a controlled drip rate and magnetic stirring to maintain the supersaturated condition. The thin native oxide layer previously formed on the recessed silicon area functions as the nucleating layer on which the siloxane oligomers selectively deposit. The LPD oxide is deposited to form a plug extending a height H above the surface of the second insulating layer 24, which will be used as a form for the deposition of the vertically extending sidewall for the stacked capacitor. The height H determines the additional capacitance of the stacked capacitor, and so the height of the plug is determined by the capacitance necessary to the operation of the DRAM, as well as by any constraints that might exist on the vertical height of the capacitor.

Figure 4:
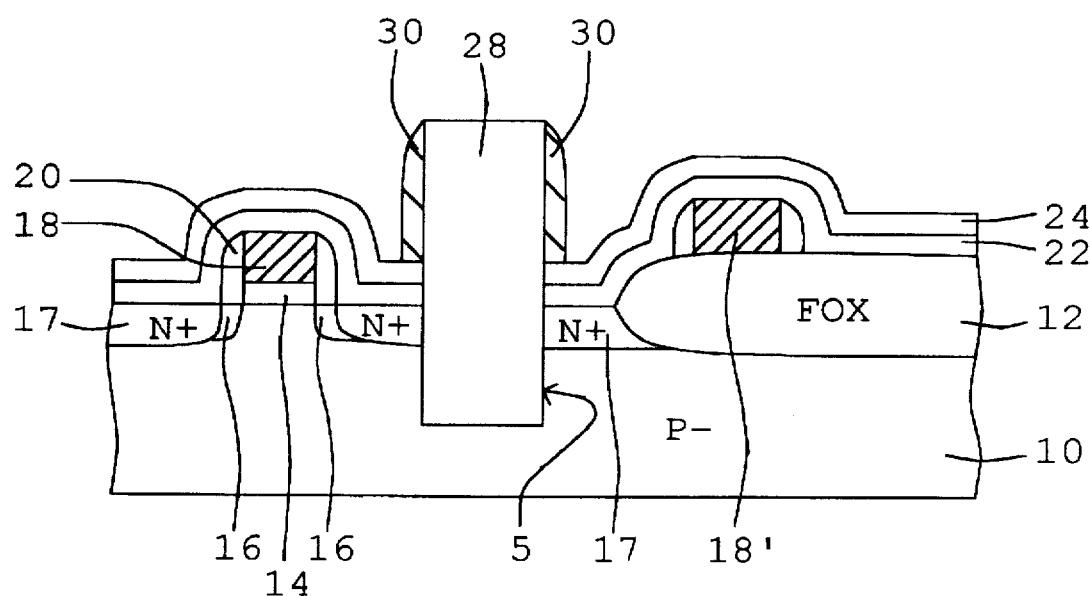

After the PLD oxide plug 28 is deposited to the preferred height H, the photoresist layer is removed by conventional means, for example, by plasma ashing in a oxygen ambient. A conformal second polysilicon layer 30 (doped or undoped) is deposited over the LPD plug 28 (form) and elsewhere on the second insulating layer 24, and then etched back to the second insulating layer 24 using an anisotropic (directional) plasma etch, thereby forming polysilicon sidewalls 30 that are self-aligned to the trench 5, as shown in FIG. 4. The second polysilicon layer 30 is deposited using LPCVD and a reactant gas, such as silane ($SiH_4$), and the preferred thickness of layer 30 is between about 500 to 3000 Å. The anisotropic plasma etch back is done in a reactive ion etcher (RIE) or other suitable plasma etcher using, for example an etching gas such as chlorine and argon. The LPD silicon oxide plug 28 still shown in FIG. 4, is now removed leaving free standing polysilicon sidewalls 30. The oxide plug 28 is then removed using a hydrofluoric acid solution ($HF/H_2O$).

The sidewall spacers 30 formed from the second polysilicon layer can also be formed out of other conducting or insulating materials provided that the spacers be unetched when the disposable plug 28 is removed in HF. Still other materials might be used if an etchant selective to the silicon oxide of the disposable plug is utilized.

Figure 5:
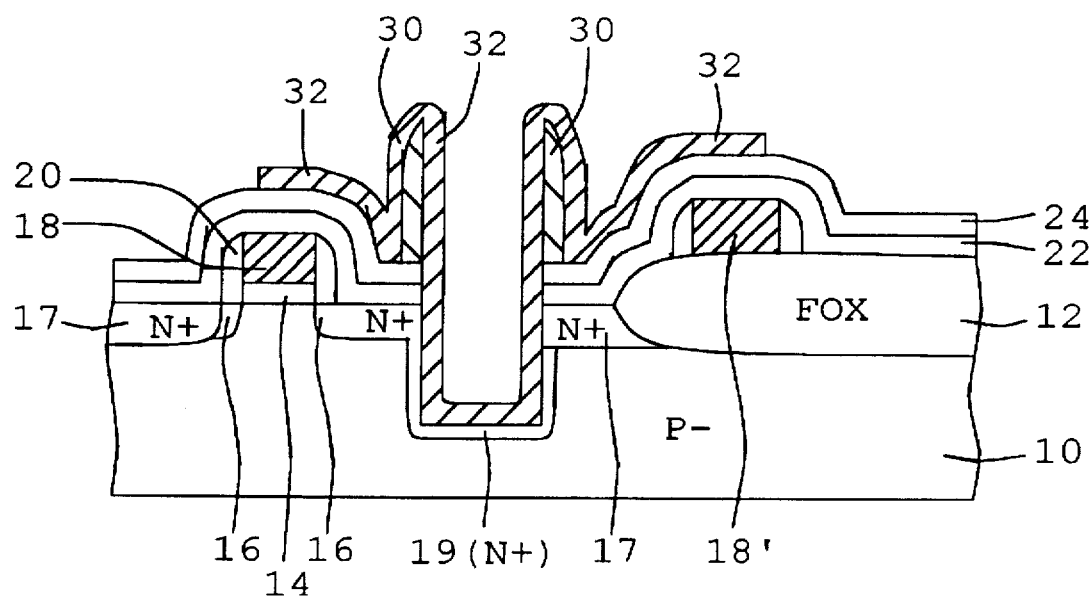

As shown in FIG. 5, the storage-node bottom electrode is now formed by depositing a conformal third polysilicon layer 32 using low pressure chemical vapor (LPCVD) deposition, and is heavily doped with an N-type dopant (impurity) such as phosphorus (P). The polysilicon layer 32 is preferably doped in situ during the polysilicon layer 32 deposition by adding, for example, the dopant gas phosphine ($PH_3$) to the reactant gas (silane). The phosphorus concentration in layer 32 is preferably between about $5.0 \times 10^{20}$ to $5.0 \times 10^{21}$ atoms/cm$^3$, and the thickness of layer 32 is preferably between about 500 to 1500 Å.

Referring still to FIG. 5, the third polysilicon layer 32 is now patterned using conventional photolithographic techniques and plasma etching to form the array of electrically isolated bottom electrodes (plates) for the stacked capacitors, although only one of the electrodes is shown in FIG. 5 to simplify the drawings. The patterned polysilicon layer 32 also serves as the storage-node bottom electrode for the silicon trench N+/P diode capacitor which is formed by out diffusion of the N-type dopant into the P-type substrate 10 to form the doped region 19 in the P-type silicon substrate, as shown in FIG. 5. The N+ doped region 19 is preferably contiguous with the source/drain area 17 forming a low resistance ohmic storage node contact to the FET.

Figure 6:
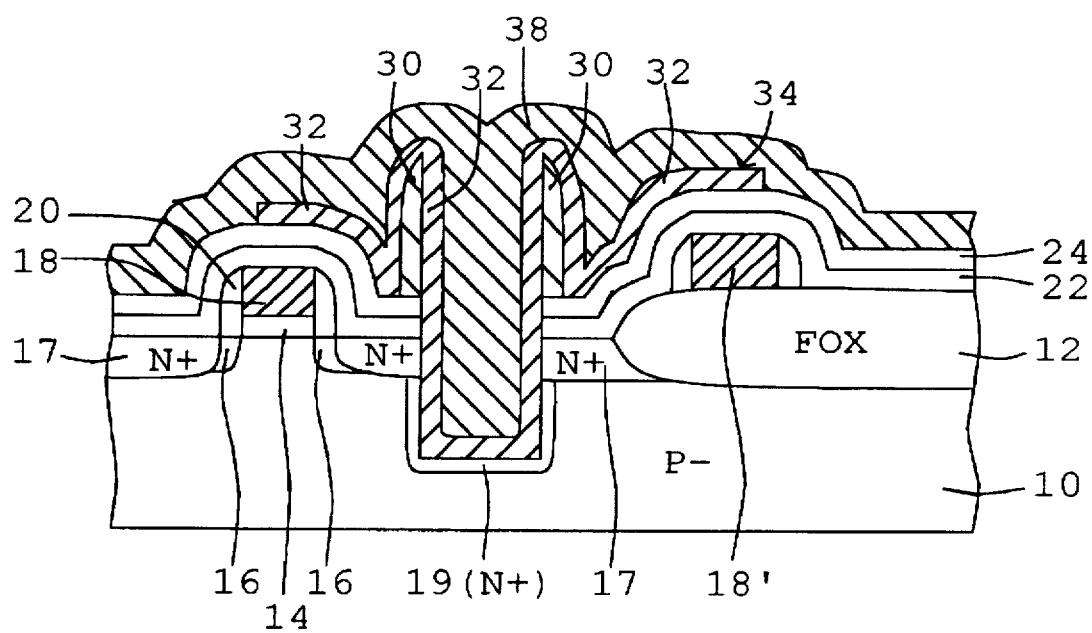

Referring now to FIG. 6, the array of trench/stacked storage capacitors is continues by forming an interelectrode dielectric insulating layer 34 having a high dielectric constant on the storage-node bottom electrodes (polysilicon layer 32). One type of high dielectric material used in the semiconductor industry for the interelectrode dielectric layer is silicon nitride ($Si_3N_4$) which is typically used in a multilayer structure composed of silicon oxide—silicon nitride—silicon oxide (ONO) which is essentially pin hole free, but is very thin to provide the highest possible capacitance. For example, a typical thickness for layer 34 is between about 40 to 100 Å, and is depicted in FIG. 6 by the label 34 pointing to the surface of bottom electrode (layer 32) rather than drawing it as a separate layer. Alternatively, other high dielectric constant materials can be used. Tantalum pentoxide ($Ta_2O_5$) is another high dielectric material that is currently being developed in the industry for use as the interelectrode dielectric layer 34.

Still referring to FIG. 6, the array of trench/stacked capacitors is now completed by forming on the interelectrode dielectric layer 34 top (ground) electrodes for the stacked capacitors. The top electrode is formed by depositing a fourth polysilicon layer 38 by LPCVD and is heavily doped with N-type dopants, such as phosphorus (P) either by ion implantation of in situ doping during the deposition. The dopant concentration in layer 38 is preferably between about $5.0 \times 10^{20}$ to $5.0 \times 10^{21}$ atoms/cm$^3$, and the thickness of layer 38 is preferably between about 1000 to 3000 Å.

Figure 7:
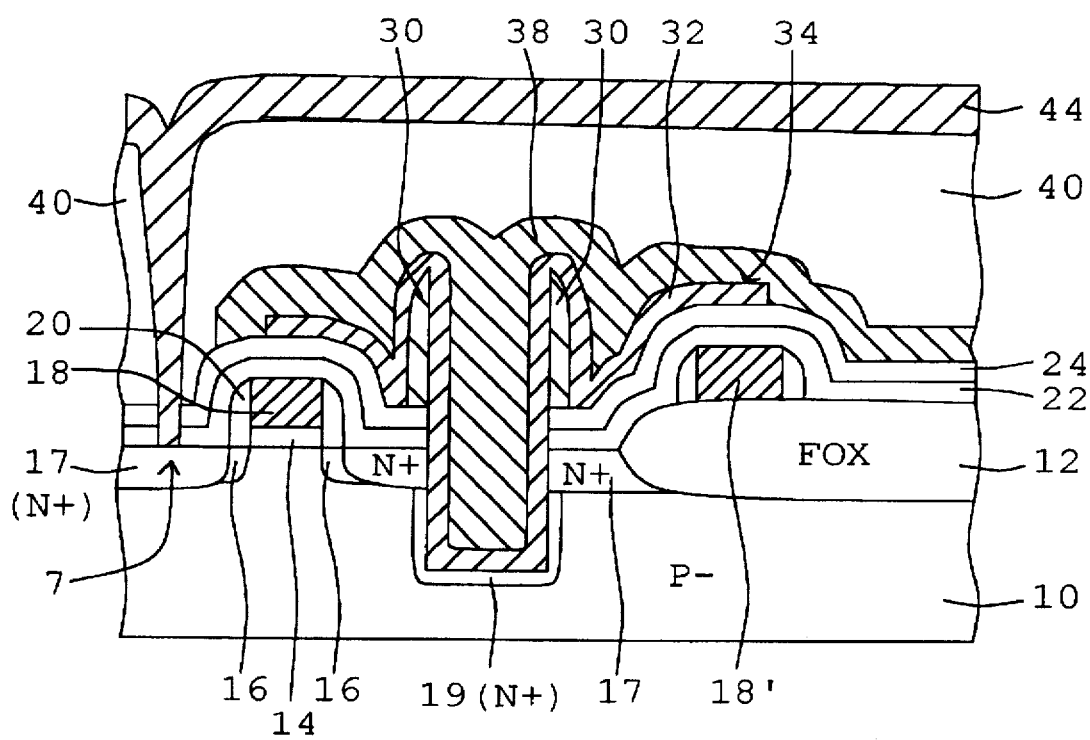

The DRAM circuit is now completed up to and including the first level interconnecting metallurgy as shown in FIG. 7. A third insulating layer 40, preferably composed of a borophosphosilicate glass (BPSG) is deposited by atmospheric pressure chemical vapor deposition (APCVD) and having a thickness of between about 4000 to 7000 Å. The BPSG is then annealed to essentially planarize the BPSG surface. Photoresist masking and plasma etching (not shown) are used to form the bit line contact openings 7, as shown in FIG. 7, to the second source/drain contact area 17 of each FET in the array of memory cells. The contact 7 is etched through the BPSG layer 40; the first insulating layer 22 (silicon oxide) and second insulating layer 24 (silicon nitride) to the source/drain area 17 using an appropriate anisotropic plasma etching. An electrically conducting layer 44 is deposited on the BPSG layer 40 and in the bit line contact openings, and then patterned to provide the first level interconnects 44, as shown in FIG. 7. One approach to forming the conducting layer 44 is to deposit a polysilicon layer heavily doped with N-type impurities, and then forming a silicide layer, such as tungsten silicide, on the polysilicon surface to further reduce the electrical resistivity. Still another approach is to form refractory metal plugs, for example, composed of tungsten (W) in the bit line contact openings 7 and then use an aluminum (Al) of aluminum copper (Al/Cu) alloy for the electrically conducting layer 44.

While the invention has been particularly shown and described with reference to the preferred embodiments thereof, it should be understood by those skilled in the art that various changes in form and details may be made without departing from the spirit and scope of the invention. It should be well understood by one skilled in the art that by including additional process steps, not specifically described herein, other types of devices can also be included on the DRAM chip. For example, by providing N-well regions in the P-substrate, P-channel FETs can also be fabricated, and CMOS circuits can be built out of the N-channel and P-channel FETs, such as those used in the peripheral CMOS circuits on the chip to randomly access the memory cells, and to store and retrieve digital information to and from the memory cells in the form of charge on the storage capacitors.

What is claimed is:

1. A process for fabricating a DRAM, comprising the steps of:

providing a substrate having an upper surface;

forming a MOS transistor on the substrate, the MOS transistor having a gate and source and drain regions; and forming a charge storage capacitor coupled to the MOS transistor, comprising the steps of:
etching a trench in the substrate adjacent to the MOS transistor,
forming a plug within the trench, a plug wall extending above the upper surface of the substrate,
depositing a spacer material over the substrate and on the plug wall,
selectively etching the plug from the spacer material and from the trench,
depositing a first polysilicon layer over the spacer material and within the trench,
forming a dielectric film over a surface of the first polysilicon layer, and
forming a second polysilicon layer over at least a portion of the dielectric film.

2. The method of claim 1 further comprising the step of doping the first polysilicon layer, rendering the first polysilicon layer conductive and coupling the first polysilicon layer to the source or drain of the MOS transistor.

3. The method of claim 2, wherein the first polysilicon layer is in contact with the substrate within the trench.

4. The method of claim 3, wherein dopants from the first polysilicon layer are diffused into the substrate immediately adjacent the trench.

5. The method of claim 1, wherein the plug comprises silicon oxide.

6. The method of claim 5, wherein the plug is formed by liquid phase deposition.

7. The method of claim 6, wherein prior to the liquid phase deposition of the plug a native oxide film is formed on the substrate within the trench.

8. The method of claim 6, wherein the liquid phase deposition is performed in a supersaturated aqueous solution of hydrofluorsilicic acid ($H_2SiF_6$) and boric acid ($H_3BO_3$) acid at a temperature of about 35° C.

9. The method of claim 1, wherein the dielectric film comprises silicon nitride and silicon oxide.

10. A method for fabricating a dynamic random access memory (DRAM) device, comprising the steps of:

providing a silicon substrate having MOS transistors formed thereon, the MOS transistors having heavily doped source/drain regions and gates formed from a patterned first polysilicon layer;

depositing a first insulating layer on the patterned first polysilicon layer and elsewhere on the substrate, forming and patterning a photoresist layer to provide openings in the photoresist layer having essentially vertical sidewalls over the source/drain areas, anisotropically etching trenches in the silicon substrate through the openings in the photoresist layer, forming on silicon surfaces in the trenches a native oxide and selectively depositing by liquid phase deposition (LPD) an LPD silicon oxide in the trenches and in the photoresist openings, the LPD silicon oxide extending above the silicon substrate surface and removing the photoresist layer to leave LPD silicon oxide plugs in the trenches and extending above the substrate surface, depositing a conformal second polysilicon layer on the LPD silicon oxide plugs and anisotropically etching back the second polysilicon layer to the first insulating layer, to form polysilicon sidewall spacers on the LPD silicon oxide plugs, selectively etching the LPD oxide to form free standing sidewall spacers self-aligned to the perimeter of the trenches, depositing and patterning a third polysilicon layer into the trenches and on the sidewall spacers to form bottom electrodes, forming an interelectrode dielectric insulating layer on the bottom electrodes, and depositing and patterning a fourth polysilicon layer to form top electrodes.

* * * * *